US012381262B2

(12) United States Patent
Kusagaya (10) Patent No.: US 12,381,262 B2
(45) Date of Patent: Aug. 5, 2025

(54) BATTERY PACK (71) Applicant: FDK CORPORATION, Tokyo (JP)

(72) Inventor: Yusuke Kusagaya, Tokyo (JP)

(73) Assignee: FDK CORPORATION, Tokyo (JP)

( * ) Notice: Subject to any disclaimer, the term of this patent is extended or adjusted under 35 U.S.C. 154(b) by 620 days.

(21) Appl. No.: 17/905,144

(22) PCT Filed: Feb. 4, 2021

(86) PCT No.: PCT/JP2021/004106
§ 371 (c)(1),
(2) Date: Aug. 26, 2022

(87) PCT Pub. No.: WO2021/192647
PCT Pub. Date: Sep. 30, 2021

(65) Prior Publication Data
US 2023/0118823 A1  Apr. 20, 2023

(30) Foreign Application Priority Data
Mar. 27, 2020  (JP) .................. 2020-057999

(51) Int. Cl.
*H01M 10/42* (2006.01)
*G01R 31/387* (2019.01)
(Continued)

(52) U.S. Cl.
CPC ........ *H01M 10/425* (2013.01); *G01R 31/387* (2019.01); *H01M 10/486* (2013.01); *H01M 50/296* (2021.01)

(58) Field of Classification Search
CPC ............. H01M 10/425; H01M 50/296; H01M 10/486; G01R 31/387
See application file for complete search history.

(56) References Cited

U.S. PATENT DOCUMENTS

2005/0231169 A1* 10/2005 Seo ...................... H01M 10/486
374/E7.031
2009/0167252 A1* 7/2009 Abe .......................... H02J 7/04
320/152
(Continued)

FOREIGN PATENT DOCUMENTS

JP  2009239989     * 10/2009
JP  2009239989 A   10/2009
(Continued)

OTHER PUBLICATIONS

JP2009239989MT (Year: 2009).*
(Continued)

*Primary Examiner* — Alexander Usyatinsky
(74) *Attorney, Agent, or Firm* — Kinney & Lange, P.A.

(57) ABSTRACT

Provided is a battery pack that is charged by being connected to a charger and discharged by being connected to a load, the battery pack including: a charge-discharge terminal 1a including a positive electrode terminal, a negative electrode terminal, and a temperature terminal; a secondary battery that is charged and discharged through the positive electrode terminal and the negative electrode terminal; a current measurement unit that measures a charge-discharge current of the secondary battery; a thermistor which is connected to the temperature terminal and which measures a battery temperature of the secondary battery; a voltage switching unit that intermittently outputs to the temperature terminal an applied voltage that causes the thermistor to operate; and a control unit that recognizes a connected state of the charge-discharge terminal on the basis of the voltage at the temperature terminal in an on-period and an off-period of the applied voltage, and the charge-discharge current.

10 Claims, 5 Drawing Sheets

(51) Int. Cl.
  *H01M 10/48* (2006.01)
  *H01M 50/296* (2021.01)

(56) References Cited

U.S. PATENT DOCUMENTS

| | | | | |
|---|---|---|---|---|
| 2010/0084150 | A1* | 4/2010 | Suzuki | H01M 50/543 |
| | | | | 173/217 |
| 2015/0236533 | A1* | 8/2015 | Yamamoto | H02J 7/0013 |
| | | | | 320/108 |

FOREIGN PATENT DOCUMENTS

| | | | | |
|---|---|---|---|---|
| JP | 2010011698 | * | 1/2010 | |
| JP | 2010011698 A | | 1/2010 | |
| JP | 2010115087 A | | 5/2010 | |
| JP | 2015154606 | * | 8/2015 | |
| JP | 2015154606 A | | 8/2015 | |
| JP | 2015173568 | * | 10/2015 | |
| JP | 2015173568 A | | 10/2015 | |
| KR | 20130047064 A | * | 5/2013 | G01R 31/382 |

OTHER PUBLICATIONS

JP2010011698 MT (Year: 2010).*
JP2015154606 MT (Year: 2015).*
The written decision of KIPO to grant a Patent for Application KR 20227032924 (Year: 2025).*
Examiner's Comment The decision of JPO to grant a Patent for Application JP 2020057999 (Year: 2024).*
JP 2015173568 MT (Year: 2015).*
Extended European Search Report for European application No. 21774904.3, dated Apr. 15, 2024, 6 pages.
International Search Report and Written Opinion dated Apr. 4, 2021, for corresponding PCT Application No. PCT/JP2021/004106.

* cited by examiner

BATTERY PACK

CROSS-REFERENCE TO RELATED APPLICATION(S)

This application is the national phase of PCT Application No. PCT/JP2021/004106 filed on Feb. 4, 2021, which claims priority to Japanese Application No. 2020-057999 filed on Mar. 27, 2020, the contents of which are incorporated herein by reference in their entirety.

BACKGROUND

Technical Field

The present disclosure relates to a battery pack.

Background Art

A battery pack that is charged by being connected to a charger and discharged by being connected to a load device is known. For example, Patent Document 1 discloses a battery pack provided with three electrode terminals including a temperature terminal in addition to the plus and minus terminals responsible for charging and discharging. Such a three-terminal battery pack is provided such that a thermistor for measuring the battery temperature of an internal secondary battery is connected to the electrode terminals. For this reason, when the electrode terminals of the battery pack are connected, the charger applies a prescribed voltage to the electrode terminals, the battery temperature of the secondary battery can be measured on the basis of a change in the resistance value of the thermistor, and charging can be controlled according to the battery temperature.

Here, even if a battery pack does not have a control unit for controlling charging, a typical charger for charging a three-terminal battery pack can still control the charging on only the charger side using a temperature terminal as above, and therefore the charger can be used as a general-purpose charger as long as the terminals can be connected to one another.

Also, the battery pack disclosed in Patent Document 1 is provided with a control circuit for controlling the state of charge according to the battery voltage and the battery temperature, and is configured to also manage the charge control on the battery pack-side according to the battery voltages of the individual battery cells.

PRIOR ART DOCUMENT

Patent Document

Patent Document 1: Japanese Patent Laid-Open No. 2010-11698

SUMMARY

However, a charger like the above is not necessarily in a charge control state when a battery pack is connected, and is also possibly in a control state that causes a secondary battery to be discharged in the case where the charger is of a type capable of performing a refresh discharge, for example. In the above battery pack, the state of the connected equipment cannot be recognized even in a case like the above, and consequently it may not be possible to protect the secondary battery depending on the control state of the charger, for example. Moreover, although there is a possibility that not only a charger but also a load may be connected to the electrode terminals of the battery pack as above, the above technology of the related art cannot distinguish between a connected state and an unconnected state of a load, and furthermore cannot recognize the control state of the load. For this reason, it may not be possible to protect the secondary battery according to these circumstances.

Here, in the case where the electrode terminals that connect a charger and a battery pack further include a terminal for communication in addition to the three terminals above, the control units of both can share the state recognition with each other. However, such a battery pack having four electrode terminals can only be charged by a dedicated charger with a common communication format, and cannot be charged using a general-purpose charger as described above.

The present disclosure has been devised in the light of such circumstances, and an object thereof is to provide a battery pack that can recognize the state of the connected equipment even if there are three electrode terminals.

In order to achieve the above object, an aspect of the present disclosure is directed to a battery pack that is charged by being connected to a charger and discharged by being connected to a load, the battery pack including: a charge-discharge terminal including a pair of power supply terminals and a temperature terminal; a secondary battery that is charged and discharged through the pair of power supply terminals; a current measurement unit that measures a charge-discharge current of the secondary battery; a thermistor which is connected to the temperature terminal and which measures a battery temperature of the secondary battery; a voltage switching unit that intermittently outputs to the temperature terminal an applied voltage that causes the thermistor to operate; and a control unit that recognizes a connected state of the charge-discharge terminal on a basis of a voltage at the temperature terminal in an on-period and an off-period of the applied voltage, and the charge-discharge current.

According to the present disclosure, a battery pack that can recognize the state of the connected equipment even if there are three electrode terminals can be provided.

DETAILED DESCRIPTION

Hereinafter, an embodiment of the present disclosure will be described in detail and with reference to the diagrams. Note that the present disclosure is not limited to the content described hereinafter, and modifications may be carried out freely in a scope that does not change the gist of the present disclosure. Also, the drawings used in the description of the embodiment are all schematic illustrations of component members that have been partially emphasized, enlarged, reduced, omitted, or the like to deepen understanding, and are not accurate representations of the scale, shape, and the like of the component members.

Figure 1:
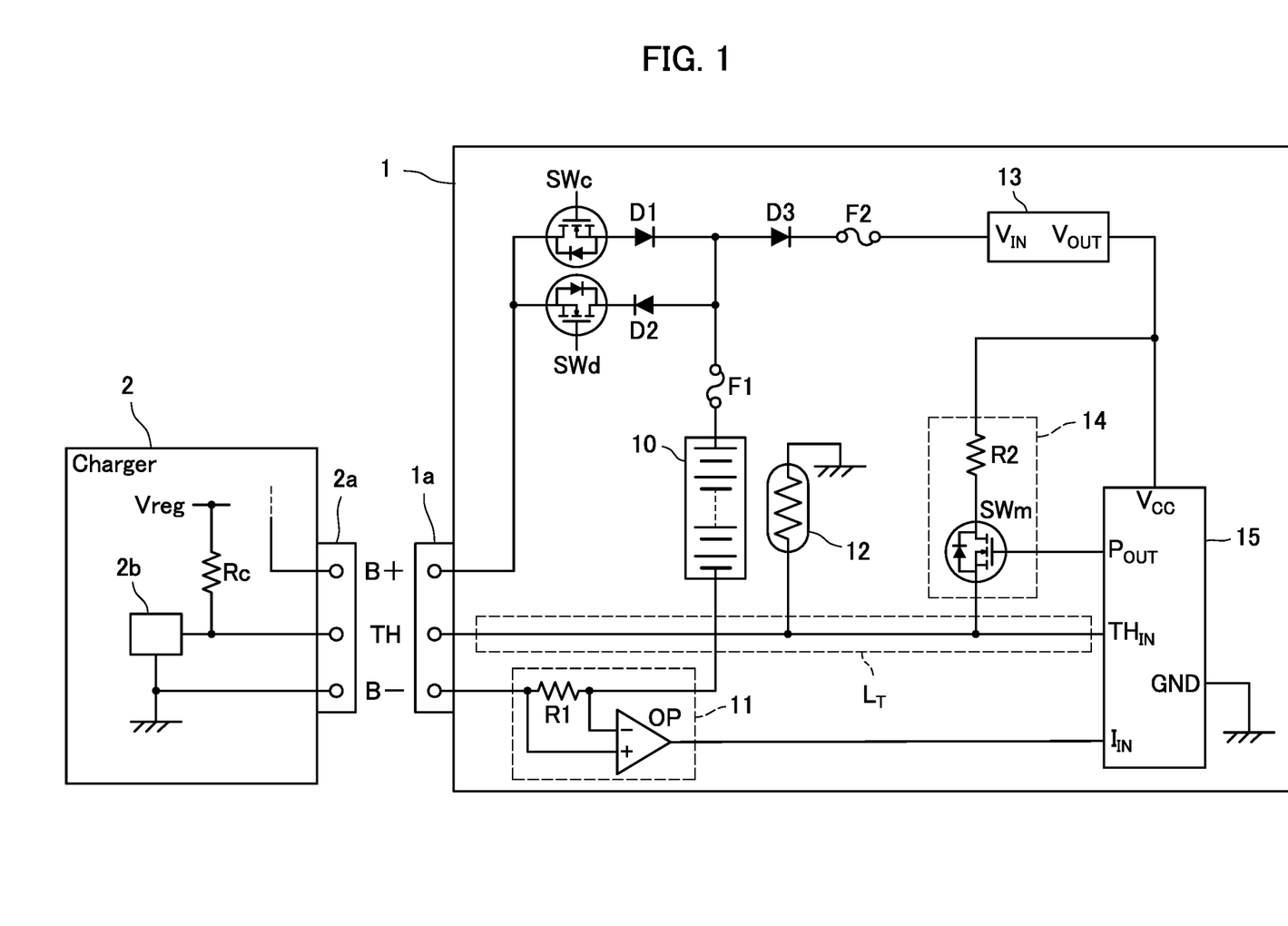
FIG. 1 is a configuration diagram illustrating a schematic configuration of a battery pack.

FIG. 1 is a configuration diagram illustrating a schematic configuration of a battery pack 1. As a main configuration, the battery pack 1 is provided with a charge-discharge terminal 1a, a secondary battery 10, a current measurement unit 11, a thermistor 12, a regulator 13, a voltage switching unit 14, and a control unit 15. Additionally, the battery pack 1 is charged by being connected to a charger 2 as a general-purpose charger, and is discharged to supply power to a load 3 described later by being connected to the load 3.

The charge-discharge terminal 1a is formed from a positive electrode terminal B+, a negative electrode terminal B−, and a temperature terminal TH, with which the charging and discharging of the battery pack 1 is performed through the pair of power supply terminals including the positive electrode B+ and the negative electrode B−. Also, the temperature terminal TH is connected to the thermistor 12 described later, and by inputting a prescribed applied voltage Va (typically 5 V) from the charger 2 causing the secondary battery 10 to go to a voltage corresponding to the battery temperature Tbat, the charger 2 is made to recognize the battery temperature Tbat.

Here, the charger 2 is a general-purpose charger including a charging port 2a that is connectible to the charge-discharge terminal 1a. The charging port 2a is formed from a positive electrode terminal B+, a negative electrode terminal B−, and a temperature terminal TH, similarly to the battery pack 1. On the basis of control by an internal charging control unit 2b, the charger 2 outputs, from the temperature terminal TH, the applied voltage Va formed by using an internal charger resistor Rc to lower an internal power supply voltage Vreg, and measures the battery temperature Tbat of the secondary battery 10 inside the battery pack 1. With this arrangement, the charger 2 can charge the secondary battery 10 via the positive electrode terminal B+ and the negative electrode terminal B− while monitoring the battery temperature Tbat.

The secondary battery 10 is formed from a nickel metal hydride battery or a lithium-ion battery, for example, and in the present embodiment is configured as a battery pack in which a plurality of battery cells are connected in series. The secondary battery 10 is configured such that its positive and negative electrodes have electrical continuity with the positive electrode terminal B+ and negative electrode terminal B−, respectively, of the charge-discharge terminal 1a.

Here, in the present embodiment, the positive electrode of the secondary battery 10 is configured to have a charging pathway in which a charge current Ic is supplied from the positive electrode terminal B+ through a charge switch SWc, a first diode D1, and a first fuse F1, and a discharging pathway in which a discharge current Id is supplied to the positive electrode terminal B+ through the first fuse F1, a second diode D2, and a discharge switch SWd. The charge switch SWc and the discharge switch SWd are N-channel metal-oxide-semiconductor field-effect transistors (MOSFETs), for example, and by controlling the gates with the control unit 15 described later, charging and discharging can each be stopped as necessary.

Additionally, in the present embodiment, the negative electrode of the secondary battery 10 is connected to the negative electrode terminal B− through the current measurement unit 11. The current measurement unit 11 is formed from a first resistor R1 and an op-amp OP, in which a charge-discharge current I of the secondary battery 10 is measured by the op-amp OP on the basis of the voltage drop across a first resistor R1 associated with the charge-discharge current I. Note that since the sign of the measurement value is different depending on the direction of the current, the charge-discharge current I is distinguished as the charge current Ic and the discharge current Id according to whether the current is flowing in the charging direction or the discharging direction.

The thermistor 12 has one end connected to the temperature terminal TH and the other end grounded, and is provided adjacent to the secondary battery 10. When a prescribed applied voltage Va is inputted into one end of the thermistor 12, the resistance value changes according to the battery temperature Tbat of the secondary battery 10, and therefore the battery temperature Tbat of the secondary battery 10 can be expressed by the voltage at the one end at the time. In the present embodiment, a conductive pathway having a shared voltage due to the connection of the temperature terminal TH and the thermistor 12 is referred to as the temperature measurement line $L_T$.

The regulator 13 is an internal power source that creates power necessary for control operations by the battery pack 1. More specifically, the regulator 13 lowers an input voltage Vin inputted from the charger 2 or the secondary battery 10 through a third diode D3 and a second fuse F2, and outputs a prescribed output voltage Vout to portions that need power in the battery pack 1. In the present embodiment, the regulator 13 supplies the output voltage Vout to the voltage switching unit 14 and the control unit 15. Here, the regulator 13 may be what is called a linear regulator, or may be a switching regulator.

The voltage switching unit 14 is formed from a series connection of a second resistor R2 and a measurement switch SWm, and outputs a voltage created from the output voltage Vout of the regulator 13 to the temperature measurement line $L_T$ described above. The measurement switch SWm is an N-channel MOSFET, for example, of which the drain is connected to the regulator 13 through the second resistor R2, the source is connected to the temperature measurement line $L_T$, and the gate is connected to the control unit 15 described later.

Here, in the voltage switching unit 14, the resistance value of the second resistor R2 is set such that the same voltage as the applied voltage Va described above for causing the thermistor 12 to operate can be outputted to the temperature measurement line $L_T$, and the applied voltage Va is outputted to the thermistor 12 intermittently on the basis of on/off control from the control unit 15.

The control unit 15 is formed from a known microcontroller circuit, for example, and ascertains the state of the secondary battery 10, such as the battery temperature Tbat and the state of charge (SOC), and as described later in detail, centrally manages the battery pack 1 as a whole, such as by recognizing the presence or absence of a connection to the charge-discharge terminal 1a and executing charge-discharge control of the secondary battery 10 according to the circumstances.

In addition, the control unit 15 is provided with a power supply input terminal Vcc, a pulse output terminal $P_{OUT}$, a temperature measurement terminal $TH_{IN}$, a current measurement terminal $I_{IN}$, and a ground terminal. With this arrangement, the control unit 15 operates by having the output voltage Vout from the regulator 13 be supplied to the power supply input terminal Vcc, controls the gate of the measurement switch SWm with the pulse output terminal $P_{OUT}$, and calculates the battery temperature Tbat and the charge-discharge current I on the basis of the voltages inputted from the temperature measurement terminal $TH_{IN}$ and the current measurement terminal $I_{IN}$.

Figure 2:
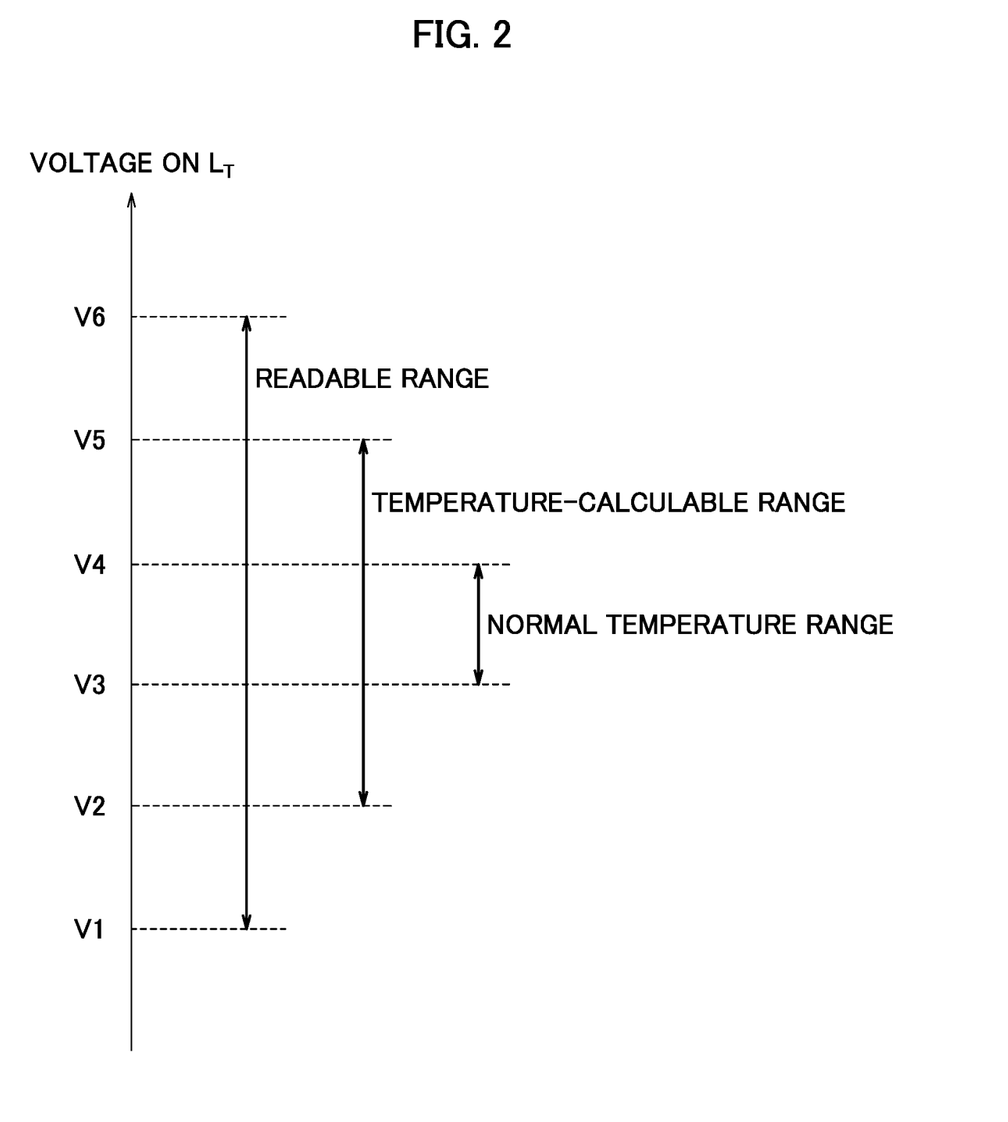
FIG. 2 is a diagram schematically illustrating the voltage range of a temperature measurement line.

FIG. 2 is a diagram schematically illustrating the voltage range of the temperature measurement line $L_T$. The control unit 15 calculates the battery temperature Tbat of the secondary battery 10 corresponding to the voltage inputted into the temperature measurement terminal $TH_{IN}$. However, due to constraints such as the number of bits in the microcontroller circuit, even if a voltage lower than the voltage V1 in FIG. 2 or a voltage higher than the voltage V6 is inputted into the temperature measurement terminal $TH_{IN}$, for example, the control unit 15 cannot recognize such voltages, and such voltages are measured as simply the voltage V1 and the voltage V6, respectively. In other words, the control unit 15 is capable of reading voltages on the temperature measurement line $L_T$ in the range from the voltage V1 to the voltage V6.

Also, in the case where the voltage on the temperature measurement line $L_T$ is included in the readable range, the control unit 15 calculates the temperature corresponding to the voltage, but in the case where the calculated temperature is in a range that is improbable as the temperature of the secondary battery 10, like the range from the voltage V1 to the voltage V2 or the range from the voltage V5 to the voltage V6 in FIG. 2, the control unit 15 determines that the battery temperature Tbat is in a non-calculable range. In other words, the control unit 15 is capable of calculating the battery temperature Tbat when the voltage on the temperature measurement line $L_T$ is in the range from the voltage V2 to the voltage V5. Note that even if the battery temperature Tbat is abnormally hot, the control unit 15 in the present embodiment determines that the temperature is in the temperature-calculable range as long as the actual temperature of the secondary battery 10 is being measured.

Furthermore, in the case where the voltage on the temperature measurement line $L_T$ is included in the temperature calculation range, the control unit 15 determines that the calculated temperature is in a normal temperature range if the temperature is appropriate as an operating temperature of the secondary battery 10.

Note that depending on the correspondence relationship between the voltage on the temperature measurement line $L_T$ and the battery temperature Tbat, the readable range and the temperature-calculable range above may be the same (V1=V2, V5=V6). In this case, if the voltage on the temperature measurement line $L_T$ is not in the temperature-calculable range, the voltage V2 (=V1) which is a lower-limit value or the voltage V5 (=V6) which is an upper-limit value is inputted into the temperature measurement terminal $TH_{IN}$.

Figure 3:
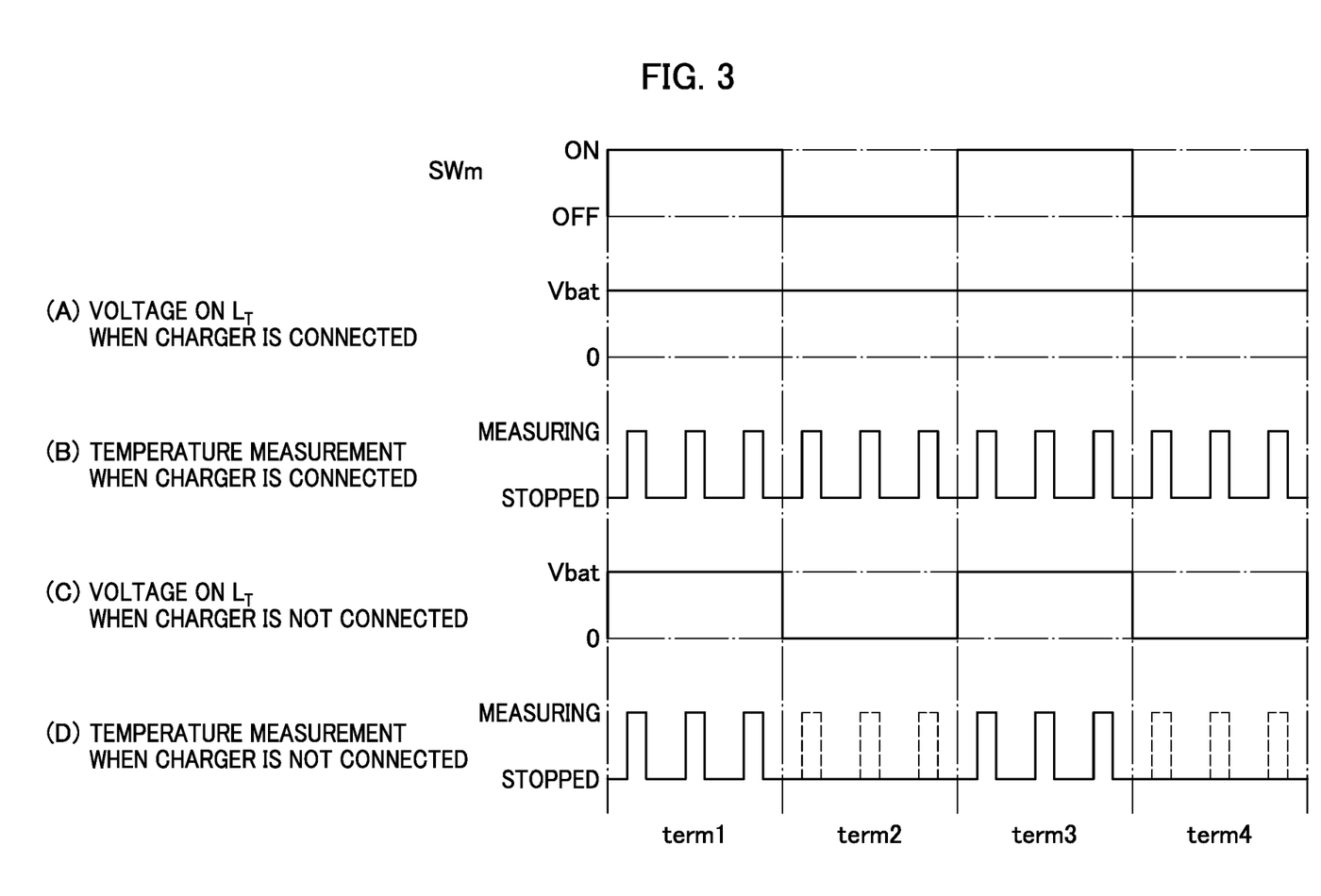
FIG. 3 is a timing chart schematically illustrating the relationship between the voltage on the temperature measurement line with respect to the on/off periods of a measurement switch and temperature measurement periods.

Next, the timings of the temperature measurement executed by the control unit 15 will be described. FIG. 3 is a timing chart schematically illustrating the relationship between the voltage on the temperature measurement line $L_T$ with respect to the on/off periods of the measurement switch SWm and temperature measurement periods. Here, for the measurement switch SWm that is repeatedly controlled on/off, a first period term1 and a third period term3 are on-periods, while a second period term2 and a fourth period term4 are off-periods. Also, the voltage on the temperature measurement line $L_T$ is assumed to be included in at least the temperature-calculable range.

Note that in FIG. 3, the on-periods and off-periods of the measurement switch SWm are at equal intervals, and the control unit 15 calculates the battery temperature Tbat three times in each period. However, the control intervals of the measurement switch SWm and the timings at which the battery temperature Tbat is calculated are not limited to the arrangement in FIG. 3. For example, for the measurement switch SWm, the on-periods may be set to 50 ms and the off-periods may be set to 950 ms, and the measurement of the battery temperature Tbat may be set to an operation cycle having an on-period of 50 ms and an off-period of 225 ms.

When the charge-discharge terminal 1a of the battery pack 1 and the charging port 2a of the charger 2 are connected, the applied voltage Va is steadily applied to the temperature measurement line $L_T$ through the temperature terminal TH, and a voltage Vbat corresponding to the battery temperature Tbat stabilizes, as illustrated in FIG. 3(A).

Consequently, as illustrated in FIG. 3(B), the control unit 15 can measure the battery temperature Tbat on the basis of the voltage on the temperature measurement line $L_T$, regardless of whether the measurement switch SWm is in an on-period or an off-period.

On the other hand, when the charger 2 is not connected to the battery pack 1, as illustrated in FIG. 3(C), the voltage on the temperature measurement line $L_T$ indicates the voltage Vbat in the on-periods, namely the first period term1 and the third period term3, of the measurement switch SWm, and indicates 0 V, or in other words a voltage value divergent from the temperature-calculable range, in the off-periods, namely the second period term2 and the fourth period term4.

Consequently, as illustrated in FIG. 3(D), the control unit 15 cannot measure the battery temperature Tbat on the basis of the voltage on the temperature measurement line $L_T$ in the off-periods of the measurement switch SWm.

In other words, the control unit 15 can recognize whether the charger 2 is connected to the battery pack 1 according to whether the battery temperature Tbat is calculable on the basis of the voltage on the temperature measurement line $L_T$ when the measurement switch SWm is in an off-period.

In addition, the control unit 15 checks whether the battery temperature Tbat is calculable on the basis of the voltage on the temperature measurement line $L_T$ when the measurement switch SWm is in an on-period, and if the calculated battery temperature Tbat is divergent from the temperature-calculable range, the control unit 15 can recognize a measurement abnormality in the thermistor 12. The above may occur when there is a fault in the thermistor 12 itself or when the thermistor 12 is separated from the secondary battery 10, for example.

Figure 4:
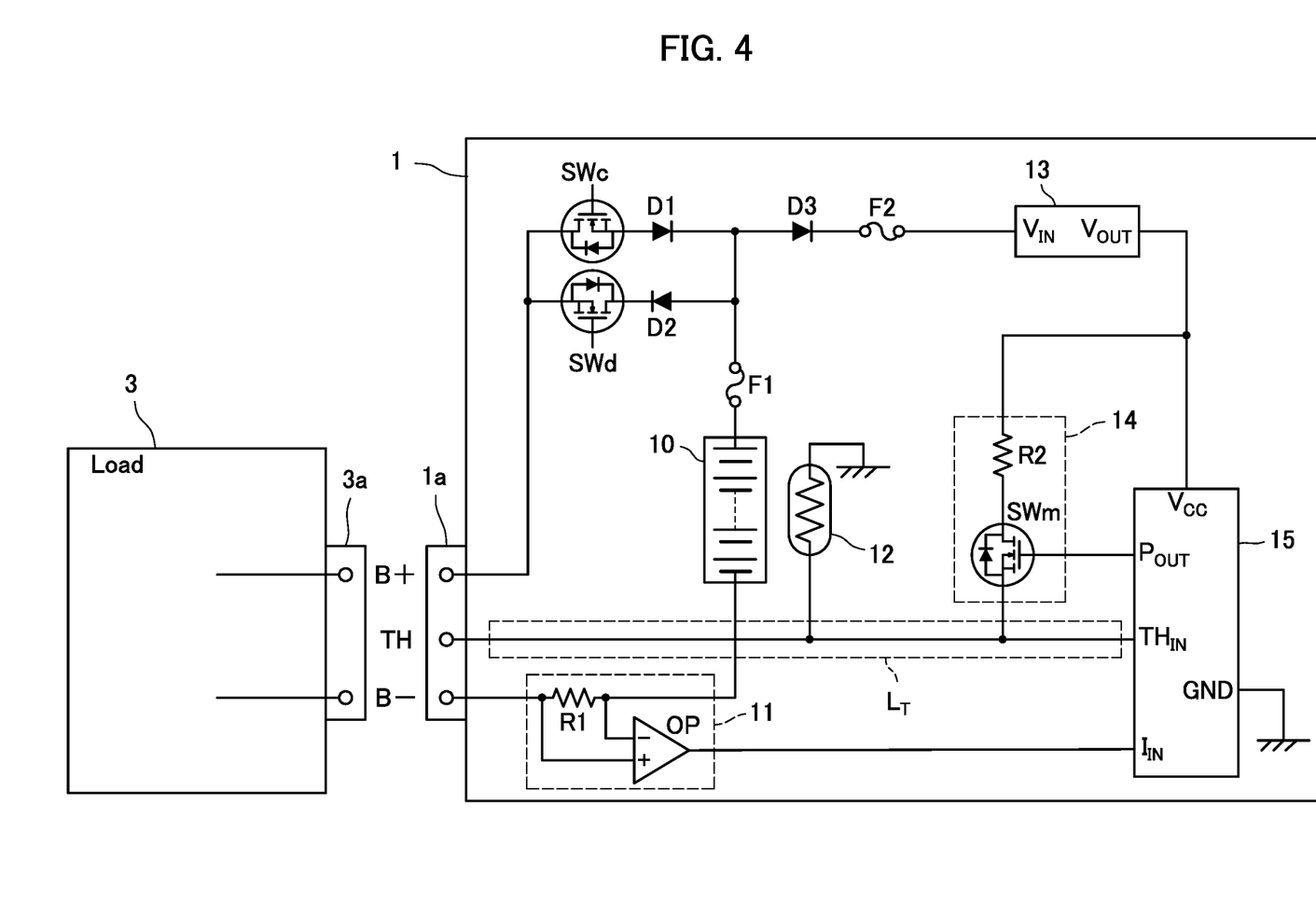
FIG. 4 is a schematic diagram illustrating how a battery pack and a load are connected.

Next, the case where the load 3 is connected to the battery pack 1 will be described. FIG. 4 is a schematic diagram illustrating how the battery pack 1 and the load 3 are connected. Since the configuration of the battery pack 1 is the same as FIG. 1, a detailed description is omitted here.

The load 3 includes a power supply port 3a connectible to the charge-discharge terminal 1a of the battery pack 1, and by respectively connecting a positive electrode terminal B+ and negative electrode terminal B− provided in the power supply port 3a to the positive electrode terminal B+ and negative electrode terminal B− of the charge-discharge terminal 1a, the load 3 can receive a supply of power from the battery pack 1. Note that since the load 3 does not recognize the battery temperature Tbat of the secondary battery 10, the power supply port 3a is not provided with a temperature terminal TH.

More specifically, when the power supply port 3a is connected to the charge-discharge terminal 1a, the load 3 is driven with power supplied from the secondary battery 10 of the battery pack 1 through the discharging pathway described above. Also, when regenerative driving is available, the load 3 can output regenerative power across the positive electrode terminal B+ and the negative electrode terminal B− to thereby supply the regenerative power to the battery pack 1 through the charging pathway described above and charge the secondary battery 10.

In other words, the battery pack 1 has a state in which the charger 2 is connected, a state in which the load 3 is connected, and a state in which nothing is connected, and the cases where the charger 2 or the load 3 is connected further include a state in which the charge current Ic is supplied and a state in which the discharge current Id is supplied. For this reason, it is necessary to recognize these states and perform appropriate control for each state. Hereinafter, a control procedure for recognizing the state of the battery pack 1 will be described.

Figure 5:
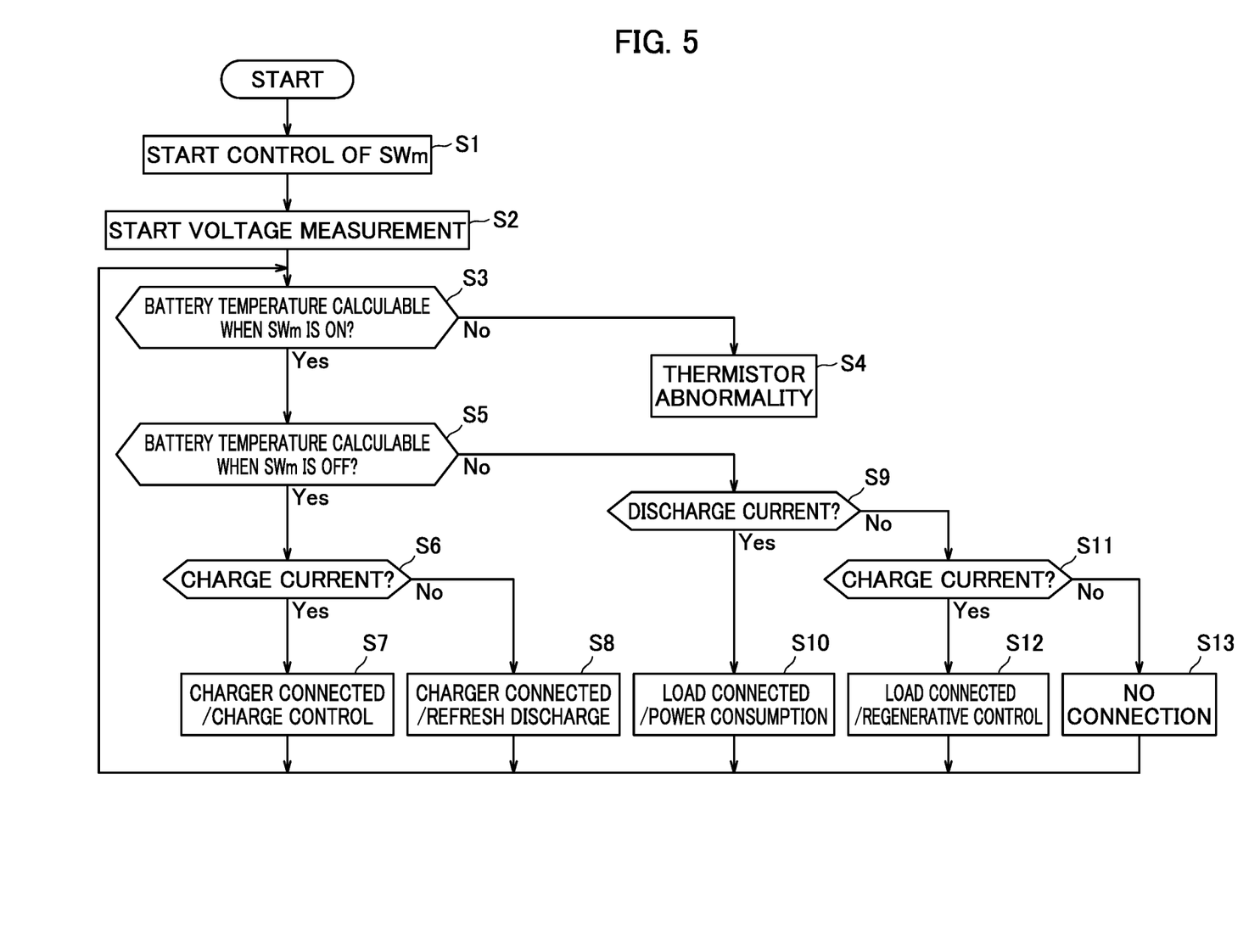
FIG. 5 is a flowchart illustrating a control procedure for state recognition executed by a control unit of a battery pack.

FIG. 5 is a flowchart illustrating a control procedure for state recognition executed by the control unit 15 of the battery pack 1. The control unit 15 is activated by power being supplied to the power supply input terminal Vcc, performs a standard charge-discharge control on the secondary battery 10 and also performs a state recognition regarding the charge-discharge terminal 1a by starting the control procedure illustrated in FIG. 5, and performs appropriate charge-discharge control according to the recognized state. Note that if any of various operating abnormalities is confirmed while the control procedure is being executed, such as the case where the battery temperature Tbat of the secondary battery 10 is outside the normal temperature range and inside the temperature-calculable range, for example, the control unit 15 may stop the charging or discharging of the secondary battery 10 and ends the control procedure, and notify the user with an error status, for example.

First, the control unit 15 starts continuous on/off control of the measurement switch SWm according to a control signal from the pulse output terminal $P_{OUT}$ (step S1). With this arrangement, a 5 V applied voltage Va is intermittently outputted to the temperature measurement line $L_T$ from the voltage switching unit 14.

Also, the control unit 15 starts voltage measurement of the temperature measurement line $L_T$ as described using FIG. 3 via the temperature measurement terminal $TH_{IN}$ (step S2). In other words, by starting the voltage measurement in step S2, the control unit 15 continuously attempts to calculate the battery temperature Tbat of the secondary battery 10 in the subsequent process while active.

Additionally, the control unit 15 determines whether it is possible to calculate the battery temperature Tbat according to the voltage at the temperature terminal TH when the applied voltage Va outputted from the voltage switching unit 14 to the temperature measurement line $L_T$ is in an on-period, or in other words, the voltage on the temperature measurement line $L_T$ (step S3; first period term1 and third period term3 in FIG. 3).

At this time, if it is not possible to calculate the battery temperature Tbat even during an on-period in which the applied voltage Va is being outputted to the temperature measurement line $L_T$ (step S3, No), the control unit 15 determines that there is an abnormality in the thermistor 12 (step S4), stops the charge-discharge control, and ends the control procedure. On the other hand, if it is possible to calculate the battery temperature Tbat during an on-period of the applied voltage Va (step S3, Yes), the control unit 15 determines that there is no abnormality related to temperature measurement in the thermistor 12 and continues the control procedure.

Next, the control unit 15 determines whether it is possible to calculate the battery temperature Tbat according to the voltage at the temperature terminal TH when the applied voltage Va from the voltage switching unit 14 is in an off-period, or in other words, the voltage on the temperature measurement line $L_T$ (step S5; second period term2 and fourth period term4 in FIG. 3).

At this time, if it is possible to calculate the battery temperature Tbat (step S5, Yes), the control unit 15 can determine that the applied voltage Va is being applied to the temperature measurement line $L_T$ from the charger 2 via the temperature terminal TH. In other words, the control unit 15 recognizes the connected state of the charger 2 on the condition that it is possible to calculate the battery temperature Tbat from the voltage at the temperature terminal TH when the applied voltage Va from the voltage switching unit 14 is in an off-period.

Additionally, the control unit 15 determines the direction of the charge-discharge current I on the basis of the voltage inputted from the current measurement terminal $I_{IN}$ (step S6), and if the charge-discharge current I is the charge current Ic (step S6, Yes), the control unit 15 can recognize the connected state of the charger 2 and recognize that the charger 2 is in a charge control state (step S7).

Also, if the charge-discharge current I is the discharge current Id (step S6, No), the control unit 15 can recognize the connected state of the charger 2 and recognize that the charger 2 is in a refresh discharge control state. In other words, even if the charger 2 is provided with a refresh discharge function, the control unit 15 can recognize the refresh discharge control state.

On the other hand, in the case where No is determined in step S5, the control unit 15 at least determines that the charger 2 is not connected, and subsequently determines whether the charge-discharge current I is the discharge current Id on the basis of the voltage inputted from the current measurement terminal $I_{IN}$ (step S9).

Additionally, if the charge-discharge current I is determined to be the discharge current Id (step S9, Yes), the control unit 15 can recognize the connected state of the load 3 and recognize that the load 3 is in a power consumption state (step S10).

In contrast, if the charge-discharge current I is determined not to be the discharge current Id (step S9, No), the control unit 15 determines whether the charge-discharge current is the charge current Ic (step S11). At this time, if the charge-discharge current I is determined to be the charge current Ic (step S11, Yes), the control unit 15 can recognize the connected state of the load 3 and recognize that the load 3 is in a regenerative control state (step S12).

Also, if No is determined in step S11, the charge-discharge current I is not being measured, and therefore the control unit 15 can recognize a state in which neither the charger 2 nor the load 3 is connected (step S13). In other words, the control unit 15 can recognize the connected state of the charger 2 on the condition that it is not possible to calculate the battery temperature Tbat from the voltage at the temperature terminal TH when the applied voltage Va from the voltage switching unit 14 is in an off-period and the charge-discharge current I is measured.

Furthermore, the control unit 15 returns to step S3 after recognizing each connected state and the control state of the connected equipment, and by repeating the above routine, the control unit 15 can continually perform the state recognition as long as the control unit 15 does not stop abnormally while active.

For this reason, the control unit 15 can handle not only the control state of the connected equipment, such as control of the charging by the charger 2 or a power request from the load 3, but can also manage the charging and discharging of the secondary battery 10 on the battery pack 1 side where the state of the secondary battery 10 can be ascertained in greater detail.

More specifically, under conditions in which, for example, the charger 2 is in the connected state and the charge control state (step S7), the control unit 15 monitors the charge current Ic and turns off a charge switch SWc if the charge current Ic rises above a prescribed charge current upper-limit value.

Also, under conditions in which, for example, the charger 2 is in the connected state and the refresh discharge control state (step S8), the control unit 15 monitors the battery voltage of the secondary battery 10 and turns off the discharge switch SWd if the battery voltage falls below a prescribed over-discharge threshold value.

Furthermore, under conditions in which, for example, the load 3 is in the connected state and the power consumption state (step S10), the control unit 15 monitors the discharge current Id and turns off the discharge switch SWd if the discharge current Id rises above a prescribed discharge current upper-limit value.

Also, under conditions in which, for example, the load 3 is in the connected state and the regenerative control state (step S12), the control unit 15 monitors the battery voltage of the secondary battery 10 and turns off the charge switch SWc if the battery voltage rises above a prescribed overcharge threshold value.

Also, under conditions in which, for example, neither the charger 2 nor the load 3 is connected (step S13), if the charge-discharge current I continues to be in a state of 0 for a prescribed period, the control unit 15 can enter a sleep state to limit standby power.

As above, the battery pack 1 intermittently outputs to the temperature terminal TH the applied voltage Va that causes the thermistor 12 to operate, and recognizes the connected state of the charge-discharge terminal 1a on the basis of the voltage at the temperature terminal TH in the on-periods and off-periods of the applied voltage Va and the charge-discharge current I. Consequently, the battery pack 1 can recognize the state of the connected equipment even if the charge-discharge terminal 1a has three terminals.

Aspects of Present Disclosure

A first aspect of the present disclosure is a battery pack that is charged by being connected to a charger and discharged by being connected to a load, the battery pack including: a charge-discharge terminal including a pair of power supply terminals and a temperature terminal; a secondary battery that is charged and discharged through the pair of power supply terminals; a current measurement unit that measures a charge-discharge current of the secondary battery; a thermistor which is connected to the temperature terminal and which measures a battery temperature of the secondary battery; a voltage switching unit that intermittently outputs to the temperature terminal an applied voltage that causes the thermistor to operate; and a control unit that recognizes a connected state of the charge-discharge terminal on a basis of a voltage at the temperature terminal in an on-period and an off-period of the applied voltage, and the charge-discharge current.

A second aspect of the present disclosure is a battery pack in which, in the first aspect of the present disclosure described above, the control unit recognizes a connection with the charger on the condition that it is possible to calculate the battery temperature from the voltage at the temperature terminal when the applied voltage is in the off-period.

A third aspect of the present disclosure is a battery pack in which, in the second aspect of the present disclosure described above, if the connection of the charger is recognized, the control unit recognizes that the charger is in a charge control state on the condition that a direction of the charge-discharge current is a charging direction.

A fourth aspect of the present disclosure is a battery pack in which, in the second aspect of the present disclosure described above, if the connection of the charger is recognized, the control unit recognizes that the charger is in a refresh discharge control state on the condition that a direction of the charge-discharge current is a discharging direction.

A fifth aspect of the present disclosure is a battery pack in which, in any of the first to fourth aspects of the present disclosure described above, the control unit recognizes a connection with the load on the condition that it is not possible to calculate the temperature of the secondary battery from the voltage at the temperature terminal when the applied voltage is in the off-period and the charge-discharge current is measured.

A sixth aspect of the present disclosure is a battery pack in which, in the fifth aspect of the present disclosure described above, if the connection of the load is recognized, the control unit recognizes that the load is in a power consumption state on the condition that a direction of the charge-discharge current is a discharging direction.

A seventh aspect of the present disclosure is a battery pack in which, in the fifth aspect of the present disclosure described above, if the connection of the load is recognized, the control unit recognizes that the load is in a regenerative control state on the condition that a direction of the charge-discharge current is a charging direction.

An eighth aspect of the present disclosure is a battery pack in which, in any of the first to seventh aspects of the present disclosure described above, the control unit recognizes that nothing is connected to the charge-discharge terminal on the condition that it is not possible to calculate the battery temperature from the voltage at the temperature terminal when the applied voltage is in the off-period and the charge-discharge current is not measured.

A ninth aspect of the present disclosure is a battery pack in which, in any of the first to eighth aspects of the present disclosure described above, the control unit recognizes a measurement abnormality in the thermistor on the condition that it is not possible to calculate the battery temperature from the voltage at the temperature terminal when the applied voltage is in the on-period.

A tenth aspect of the present disclosure is a battery pack in which, in any of the first to ninth aspects of the present disclosure described above, the control unit prohibits charging and discharging of the secondary battery on the condition that the battery temperature calculated from the voltage at the temperature terminal when the applied voltage is in the on-period is not in a prescribed normal temperature range.

EXPLANATION OF REFERENCE SIGNS 1 battery pack
2 charger
3 load
10 secondary battery
11 current measurement unit
12 thermistor 13 regulator
14 voltage switching unit
15 control unit
1a charge-discharge terminal
B+ positive electrode terminal
B− negative electrode terminal
TH temperature terminal
$L_T$ temperature measurement line

The invention claimed is:

1. A battery pack that is charged by being connected to a charger and discharged by being connected to a load, the battery pack comprising:
   a charge-discharge terminal including a pair of power supply terminals and a temperature terminal;
   a secondary battery that is charged and discharged through the pair of power supply terminals;
   a current measurement unit that measures a charge-discharge current of the secondary battery;
   a thermistor which is connected to the temperature terminal and which measures a battery temperature of the secondary battery;
   a voltage switching unit that intermittently outputs to the temperature terminal an applied voltage that causes the thermistor to operate; and
   a control unit that recognizes a connected state of the charge-discharge terminal on a basis of a voltage at the temperature terminal in an on-period and an off-period of the applied voltage, and the charge-discharge current.

2. The battery pack according to claim 1, wherein the control unit recognizes a connection with the charger in response to determining that it is possible to calculate the battery temperature from the voltage at the temperature terminal when the applied voltage is in the off-period.

3. The battery pack according to claim 2, wherein in response to the connection of the charger being recognized, the control unit recognizes that the charger is in a charge control state on the condition that a direction of the charge-discharge current is a charging direction.

4. The battery pack according to claim 2, wherein in response to the connection of the charger being recognized, the control unit recognizes that the charger is in a refresh discharge control state on the condition that a direction of the charge-discharge current is a discharging direction.

5. The battery pack according to claim 1, wherein the control unit recognizes a connection with the load in response to determining that it is not possible to calculate the temperature of the secondary battery from the voltage at the temperature terminal when the applied voltage is in the off-period and the charge-discharge current is measured.

6. The battery pack according to claim 5, wherein in response to the connection of the load being recognized, the control unit recognizes that the load is in a power consumption state on the condition that a direction of the charge-discharge current is a discharging direction.

7. The battery pack according to claim 5, wherein in response to the connection of the load being recognized, the control unit recognizes that the load is in a regenerative control state on the condition that a direction of the charge-discharge current is a charging direction.

8. The battery pack according to claim 1, wherein the control unit recognizes that nothing is connected to the charge-discharge terminal in response to determining that it is not possible to calculate the battery temperature from the voltage at the temperature terminal when the applied voltage is in the off-period and the charge-discharge current is not measured.

9. The battery pack according to claim 1, wherein the control unit recognizes a measurement abnormality in the thermistor in response to determining that it is not possible to calculate the battery temperature from the voltage at the temperature terminal when the applied voltage is in the on-period.

10. The battery pack according to claim 1, wherein the control unit prohibits charging and discharging of the secondary battery on the condition that the battery temperature calculated from the voltage at the temperature terminal when the applied voltage is in the on-period is not in a prescribed normal temperature range.

* * * * *